United States Patent
Burke et al.

(10) Patent No.: US 7,423,317 B2
(45) Date of Patent: Sep. 9, 2008

(54) SPLIT ELECTRODE GATE TRENCH POWER DEVICE

(75) Inventors: Hugo R. G. Burke, PontyClun (GB); David Paul Jones, South Glamorgan (GB); Ling Ma, Torrance, CA (US); Robert Montgomery, South Glamorgan (GB)

(73) Assignee: International Rectifier Corporation, El Segundo, CA (US)

( * ) Notice: Subject to any disclaimer, the term of this patent is extended or adjusted under 35 U.S.C. 154(b) by 10 days.

(21) Appl. No.: 11/491,743

(22) Filed: Jul. 24, 2006

(65) Prior Publication Data

US 2007/0023829 A1    Feb. 1, 2007

Related U.S. Application Data

(60) Provisional application No. 60/702,919, filed on Jul. 27, 2005.

(51) Int. Cl.
*H01L 29/739*    (2006.01)

(52) U.S. Cl. .......... 257/331; 257/330; 257/329; 257/332; 257/E29.131; 257/E29.201; 438/270; 438/271

(58) Field of Classification Search ........ 257/330, 257/329, 331, 332, E29.131, E29.201; 438/270, 438/271
See application file for complete search history.

(56) References Cited

U.S. PATENT DOCUMENTS

| 6,387,803 B2 * | 5/2002 | Talwar et al. ........... 438/682 |
| 6,573,569 B2 * | 6/2003 | Hao et al. ............... 257/376 |
| 7,061,047 B2 * | 6/2006 | Ono et al. ............... 257/330 |
| 2006/0049453 A1 * | 3/2006 | Schmitz et al. .......... 257/330 |

OTHER PUBLICATIONS

Search Report issued in corresponding PCT Application No. PCT/US06/29384 dated Oct. 4, 2007.

* cited by examiner

*Primary Examiner*—Victor A. Manala, Jr.
(74) *Attorney, Agent, or Firm*—Ostrolenk, Faber, Gerb & Soffen, LLP

(57) ABSTRACT

A power semiconductor device which includes gate liners extending along gate insulation liners and an insulation block spacing the two gate liners.

12 Claims, 3 Drawing Sheets

SPLIT ELECTRODE GATE TRENCH POWER DEVICE

RELATED APPLICATION

This application is based on and claims the benefit of U.S. Provisional Application Ser. No. 60/702,919, filed on Jul. 27, 2005, entitled SPLIT ELECTRODE GATE TRENCH MOSFET STRUCTURE AND PROCESS AND $SF_6$ ETCH PROCESS, to which a claim of priority is hereby made and the disclosure of which is incorporated by reference.

FIELD OF THE INVENTION

The present invention related to power semiconductor devices and more particularly to MOSgated trench type power semiconductor devices.

BACKGROUND OF THE INVENTION

Power semiconductor devices are used prevalently in power management applications, for example, power converters and power supplies. In many applications, efficiency of the power converter is strongly related to the efficiency of the power semiconductor device used therein. To obtain a higher efficiency, the current carrying capability of the semiconductor device must be improved which reduces its on resistance. To increase the current carrying capability of, for example, a trench type MOSgate device the pitch (the cell to cell distance) can be reduced. However, to reduce the pitch, the gate charge must also be reduced to reduce Qgd.

It is desirable to improve the current carrying capability of a power semiconductor device without having adverse effects on Qgd.

SUMMARY OF THE INVENTION

A power semiconductor device according to the present invention includes a semiconductor body having a drift region of one conductivity, and a base region of another conductivity, a gate trench extending at least through the base region, gate insulation liner lining at least the sidewalls of the gate trench, a gate electrode adjacent each gate insulation, an insulation block interposed between the gate electrodes and adjacent each gate electrode, a conductive regions of the one conductivity adjacent the gate trench, and a first power electrode electrically connected to the conductive regions.

According to one aspect of the present invention, gate electrode mass is reduced (reducing gate charge), and the overlap between the gate electrode and the drain is also reduced, thus reducing Qgd. As a result, prior art solutions requiring, for example, a thick oxide at the bottom of the trench may be eliminated.

A device according to the present invention may further include a connector connecting the gate electrodes.

To reduce the resistance of the gates, each gate electrode can include a silicided portion that makes electrical contact with a gate runner, and/or the gate electrodes are made proud of the semiconductor body.

Other features and advantages of the present invention will become apparent from the following description of the invention which refers to the accompanying drawings.

BRIEF DESCRIPTION OF THE DRAWINGS

FIGS. 2A-2J illustrate selected steps in the fabrication of a power semiconductor device according to the present invention.

DETAILED DESCRIPTION OF THE EMBODIMENTS

Figure 1:
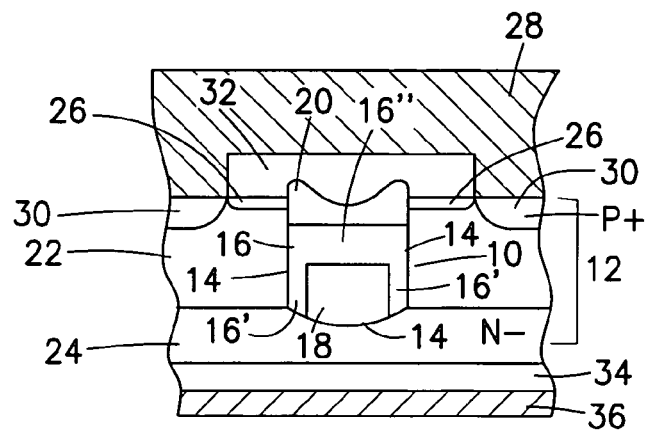
FIG. 1 illustrates a cross-sectional view of a single cell of a power semiconductor device according to the first embodiment of the present invention.

Referring to FIG. 1, an active cell of a power device, which is preferably a power MOSFET, includes a gate trench 10 formed in a semiconductor body 12, for example, an epitaxially formed silicon. Gate oxide liner 14 lines at least each sidewall of trench 10, and preferably also the bottom thereof. A gate electrode 16 is disposed inside trench 10 adjacent gate oxide 14. In the first embodiment of the present invention, gate electrode 16 has a π-shaped cross-section with two vertically oriented fingers 16', and a horizontally oriented connector 16", linking the two opposing and spaced fingers 16'. The space between fingers 16' is filled with an insulation block 18. Gate electrode 16 is preferably made of conductive polysilicon having the top thereof silicided 20 in order to increase the conductivity thereof. Siliciding is particularly advantageous in reducing Rg (gate resistance) when gate trenches 10 are narrowed. To be specific, in a device according to the present invention, at least one gate runner is provided to connect the gate electrodes to one another. In the preferred embodiment, the silicided portions are connected to the runner in order to reduce the resistance between the runner and the gate electrodes, thereby reducing the overall Rg of the device.

A power MOSFET according to the preferred embodiment includes drift region 24 of one conductivity (e.g., N-type), base region 22 of another conductivity (e.g., P-type), source regions 26 of the one conductivity, source electrode 28 which is ohmically connected to source regions 26, and shorted to base region 22 through high conductivity contact regions 30 of the same conductivity as base region 22, but insulated from gate electrode 16 by an insulation cap 32. It should be noted that drift layer 24 is formed preferably over a silicon substrate 34 of the one conductivity. Drain electrode 36 is ohmically connected to substrate 34, whereby current travels vertically from source electrode 28 to drain electrode 36 when a channel is formed in base region 22 adjacent trench 10 between source region 26 and drift region 24 upon application of at least the threshold voltage to gate electrode 16.

Returning to FIGS. 2A-2J, to fabricate a device according to the first embodiment of the present invention, a semiconductor body 12, which includes source region 26, base region 22, and drift region 24 is masked with a hard mask 38 (e.g., $Si_3N_4$ mask). Hard mask 38 includes openings 40, which define areas in semiconductor body 12 to be trenched. Thereafter, a gate trench 10 is formed in semiconductor body 12 at least through base region 22 using any suitable etching method to obtain the structure shown in FIG. 2A.

Figure 2C:
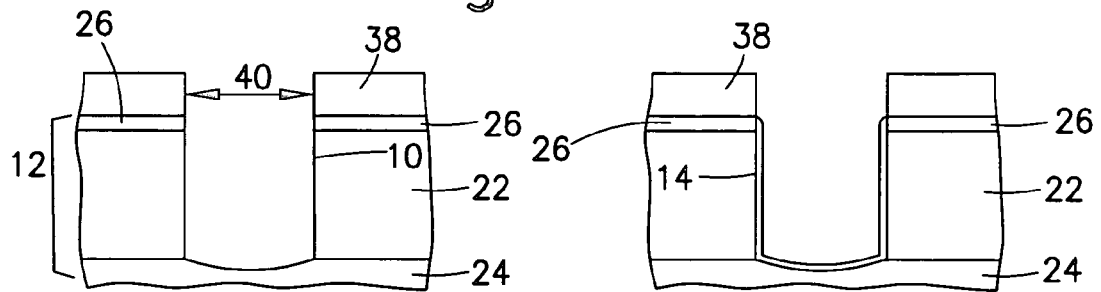
Figure 2C:
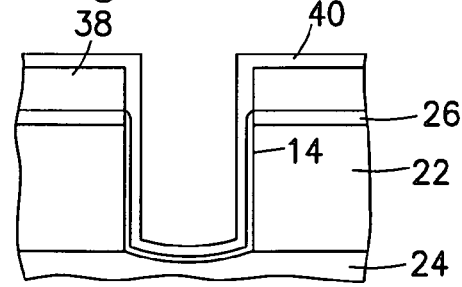
Figure 2D:
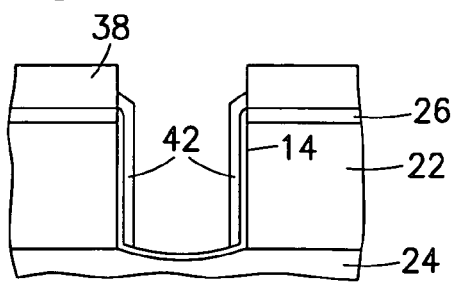
Figure 2E:
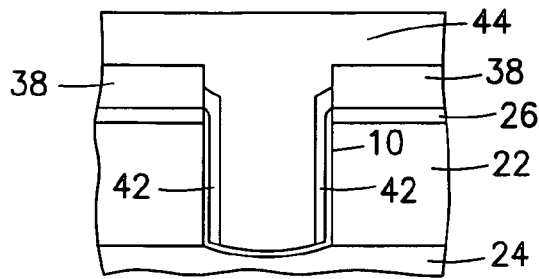

Next, the sidewalls and the bottom of trench 10 are oxidized using any known method to form gate insulation/oxide 14 thereon to a thickness of preferably 500 Å, as illustrated by FIG. 2B. Thereafter, a layer of polysilicon 40 is deposited to cover at least gate insulation 14 as seen in FIG. 2C, and then any excess polysilicon 40 is removed from at least the bottom of trench 10 (leaving oxide behind) leaving polysilicon liners 42 along the sidewall of trench 10, as illustrated by FIG. 2D.

Figure 2F:
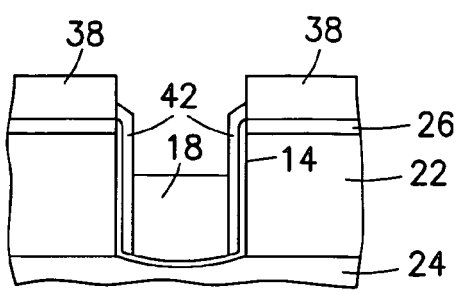

Next, an oxide filler 44 is deposited to fill at least trench 10 (FIG. 2E), and then a portion thereof is removed to leave insulation/oxide block 18 at the bottom of trench 10 as seen in FIG. 2F.

Figure 2G:
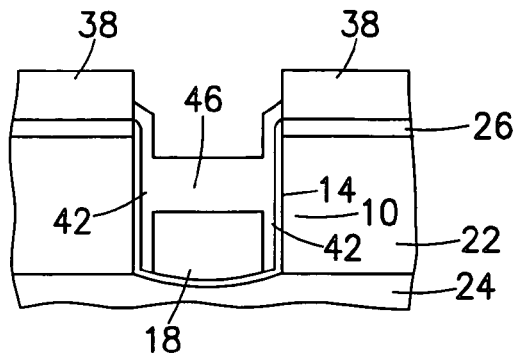
Figure 2H:
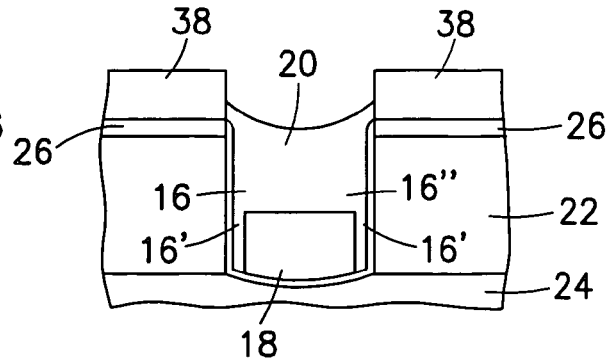
Figure 2I:
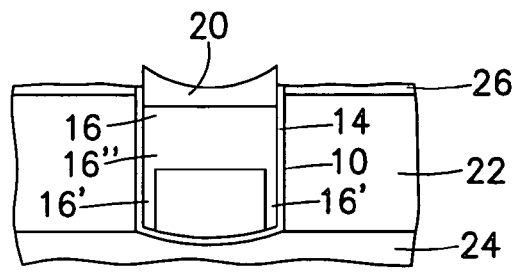
Figure 2J:
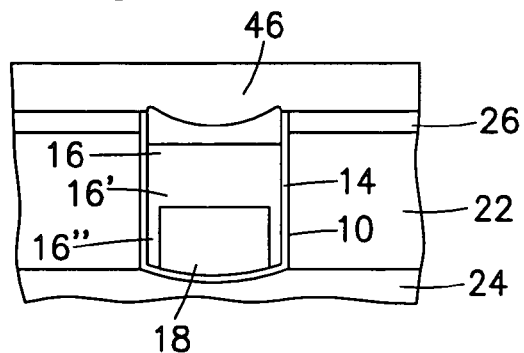

Next, polysilicon 46 is deposited over oxide block 18 to connect polysilicon liners 42 as illustrated by FIG. 2G. Polysilicon 46 is then silicided to form silicide body 20, as illustrated by FIG. 2H. Note that as a result, gate electrode 16 is formed in this step.

Next, hard mask 38 is removed (FIG. 2I), and a preferably low density oxide body 46 (e.g., TEOS) is deposited over at least silicide body 20. Thereafter, conventional steps are carried out to obtain a device as illustrated by FIG. 1. It should be appreciated that although only a single active cell and a process for forming a single active cell are illustrated by FIGS. 1, 2A-2J, in a device according to the present invention a plurality of active cells would be formed simultaneously. Thus, the present invention should not be understood to be limited to a single active cell.

Figure 3:
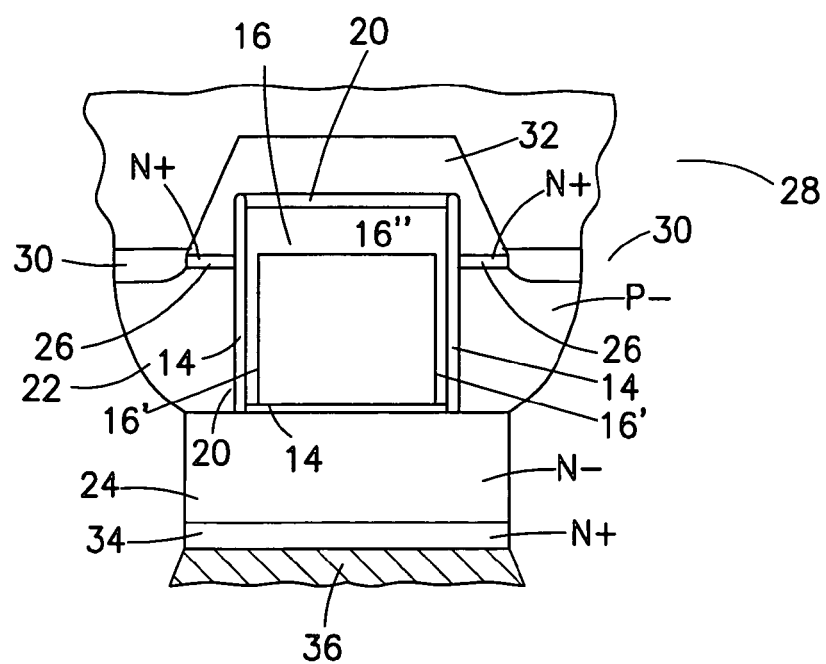
FIG. 3 illustrates a cross-sectional view of a single active cell of a device according to the second embodiment of the present invention.

Referring next to FIG. 3, in a device according to the second embodiment, the sidewalls of trench 10 are tapered. Moreover, gate electrode 16 is proud of gate trench 10, i.e., extends outside of trench 10 above the top surface of semiconductor body 12.

To fabricate a device according to the second embodiment, trench 10 is formed to have tapered sidewalls instead of vertical sidewalls. To obtain the proud gates, polysilicon 44 (FIG. 2F) is left inside opening 40 of mask 38, silicided, and then when mask 38 is removed, gate electrode 16 is left proud of trench 10.

Figure 4:
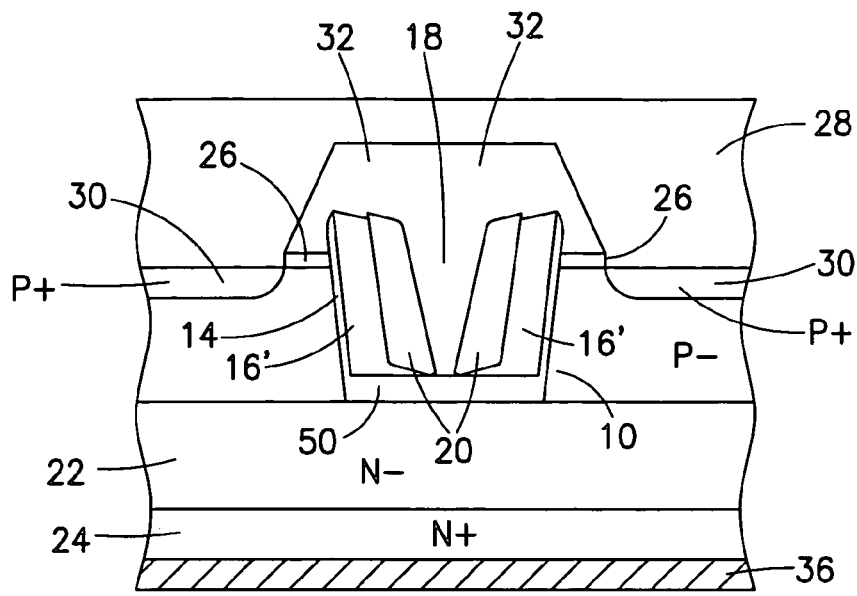
FIG. 4 illustrates a cross-sectional view of a single active cell of a device according to the third embodiment of the present invention.
Figures 5A, 5B:
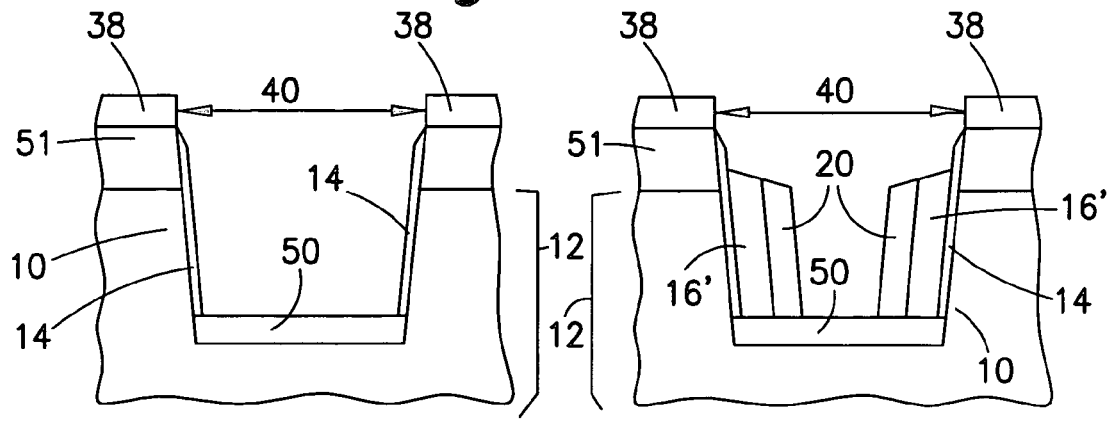
FIGS. 5A-5D illustrate selected steps in the process for fabrication of a device according to the third embodiment.

Referring to FIG. 4, a device according to the third embodiment also includes gate trench 10 with preferably tapered sidewalls. However, unlike the first and the second embodiments, gate electrode 16 does not include connector portion 16". Thus, the third embodiment includes only gate fingers 16' (or gate liners 16'). Furthermore, a thick oxide body 50 is disposed at the bottom of gate trench 10 extending below gate liners 16'. Thus, in a modified process, after forming gate oxide 14 on the tapered sidewalls of a gate trench 10, a trench oxide 50 is formed at the bottom of trench 10 as illustrated by FIG. 5A. (Note that in a process for fabricating the second and third embodiments, a polysilicon body 51 is optionally formed over semiconductor body 12 and under hard mask 38. Polysilicon body 51 is used to improve hard mask 38. Specifically, in order to prevent the undue straining of hard mask 38 polysilicon 51 is used, which allows one to build up and create the "proud" structure without inducing undue stress.)

Figures 5C, 5D:
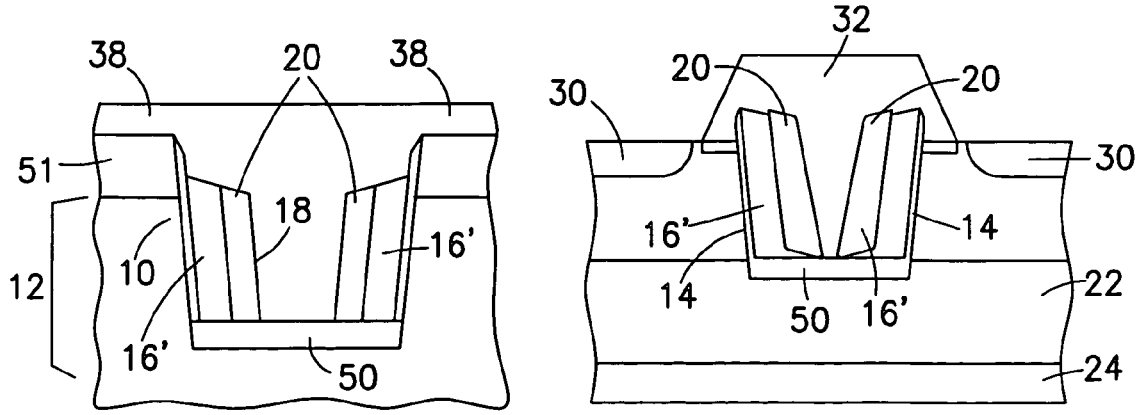

Next, polysilicon gate liners 16' are found adjacent the sidewalls of trench 10 by polysilicon deposition and etching. The polysilicon gate lines 16' may be made proud by extending beyond trench 10, and optionally (or alternatively) silicide 20 to reduce Rg. Thereafter, as illustrated by FIG. 5C, oxide is deposited inside the trench thereby forming oxide/insulation block 18.

After the oxide deposition, hard mask 38, and underlying polysilicon 51 are removed to expose the silicon below, and source regions 26, regions 30, base region 22 are formed through conventional implementation and diffusion steps followed by conventional steps to form electrodes 28 and 36 to obtain a device according to the third embodiment.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device, comprising: a semiconductor body including a drift region of one conductivity, and a base region of another conductivity; a gate trench extending at least through said base region; gate insulation liner lining at least the sidewalls of said gate trench; a gate electrode adjacent each said gate insulation liner; an insulation block interposed between said gate electrodes and adjacent each gate electrode; a conductive regions of said one conductivity adjacent said gate trench; and a first power electrode electrically connected to said conductive regions; and a connector connecting said gate electrodes, wherein said connector is proud of said semiconductor body, is not wider than said gate trench, and includes a silicided top portion.

2. The device of claim 1, wherein said device is a power MOSFET.

3. The device of claim 1, further comprising an insulation body at the bottom of said gate trench, said insulation body being thicker than said gate insulation liners.

4. The device of claim 3, wherein said gate insulation liners, said insulation block, and said insulation body are comprised of an oxide.

5. The device of claim 1, further comprising a substrate of said one conductivity, said semiconductor body being disposed on said substrate and further comprising a second power electrode electrically connected to said substrate.

6. The device of claim 5, wherein said first power electrode is a source electrode, said second power electrode is a drain electrode, and said conductive regions are source regions.

7. The device of claim 1, wherein said sidewalls of said gate trench are tapered.

8. A method of fabricating a power semiconductor device, comprising:
    forming a trench mask that includes and opening over a semiconductor body that includes a drift region and a base region adjacent said drift region;
    forming a trench at bottom of said opening that extends through said base region;
    oxidizing at least the sidewalls of said trench to form gate liners adjacent said sidewalls;
    covering said oxidized sidewalls with an electrically conductive material to form gate electrodes;
    depositing an insulation block between said gate liners electrodes and adjacent each gate liner electrode;
    depositing conductive material inside said open to link said gate electrodes with a conductive connector, said conductive connector extending above said semiconductor body;
    and removing said trench mask to obtain a conductive connector that is proud of said semiconductor body.

9. The method of claim 8, further comprising forming an insulation body at the bottom of said trench, said insulation body being thicker than said gate liners.

10. The method of claim 8, said conductive material comprises conductive polysilicon.

11. The method of claim 8, wherein said gate liners are proud of said semiconductor body.

12. The method of claim 8, further comprising siliciding a top portion of said connector.

* * * * *